United States Patent
Oh et al.

(10) Patent No.: US 7,176,126 B2
(45) Date of Patent: Feb. 13, 2007

(54) METHOD OF FABRICATING DUAL DAMASCENE INTERCONNECTION

(75) Inventors: Hyeok-sang Oh, Suwon-si (KR); Ju-hyuck Chung, Suwon-si (KR); Il-goo Kim, Yongin-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/157,363

(22) Filed: Jun. 21, 2005

(65) Prior Publication Data

US 2006/0024948 A1    Feb. 2, 2006

(30) Foreign Application Priority Data

Jul. 29, 2004    (KR)    ............ 10-2004-0059888

(51) Int. Cl.
*H01L 21/4763*    (2006.01)

(52) U.S. Cl. ............ 438/638; 438/637; 257/E21.579

(58) Field of Classification Search ............ 438/638, 438/637, FOR. 355, FOR. 489; 257/E21.579
See application file for complete search history.

(56) References Cited

U.S. PATENT DOCUMENTS

| | | | |
|---|---|---|---|
| 6,140,226 A * | 10/2000 | Grill et al. | 438/637 |
| 6,406,995 B1 * | 6/2002 | Hussein et al. | 438/638 |
| 2001/0029105 A1 * | 10/2001 | Seta et al. | 438/694 |
| 2002/0025670 A1 | 2/2002 | Miyata | 438/637 |
| 2002/0173143 A1 * | 11/2002 | Lee et al. | 438/637 |
| 2003/0003716 A1 * | 1/2003 | Kim | 438/638 |
| 2003/0082924 A1 * | 5/2003 | Andideh et al. | 438/778 |

FOREIGN PATENT DOCUMENTS

| | | |
|---|---|---|
| JP | 2001-332619 | 11/2001 |
| JP | 2001-358218 | 12/2001 |
| KR | 10-2004-0000900 | 1/2004 |

\* cited by examiner

*Primary Examiner*—Michelle Estrada
(74) *Attorney, Agent, or Firm*—Mills & Onello LLP

(57) ABSTRACT

In a method of fabricating a dual damascene interconnection, a reliable trench profile is secured. The method includes forming a lower interconnect feature on a substrate, forming a dielectric layer on the lower interconnect feature, forming a hard mask on the dielectric layer, forming a via in the dielectric layer using the hard mask as an etch mask, forming a trench hard mask defining a trench by patterning the hard mask, forming a trench, which is connected with the via and in which an upper interconnection line is formed, by partially etching the dielectric layer using the trench hard mask as an etch mask, removing the trench hard mask using wet etch, and forming an upper interconnection line by filling the trench and the via with an interconnection material.

18 Claims, 7 Drawing Sheets

METHOD OF FABRICATING DUAL DAMASCENE INTERCONNECTION

RELATED APPLICATIONS

This application claims priority from Korean Patent Application No. 10-2004-0059888 filed on Jul. 29, 2004 in the Korean Intellectual Property Office, the disclosure of which is incorporated herein by reference in its entirety.

BACKGROUND OF THE INVENTION

1. Field of the Invention

The present invention relates to a method of fabricating a microelectronic device, and more particularly, to a method of fabricating a dual damascene interconnection of a microelectronic device.

2. Description of the Related Art

With rapid progress and development in the techniques available to produce high-speed, highly-integrated logic devices, new techniques for fabrication of miniaturized transistors have been developed. As the integration level of the transistors is increased, interconnections become smaller and smaller. As a result, the problem of interconnection delay becomes incrementally more serious, impeding the attainment of high-speed logic devices.

In view of the above, interconnections that employ copper having lower resistance and higher electromigration (EM) tolerance as an interconnection material, instead of an aluminum alloy, which have been conventionally and generally used in interconnecting large scale integrated (LSI) semiconductor devices, have been actively developed. However, copper is relatively difficult to etch and is prone to oxidation. Accordingly, a dual damascene process has been developed to form such a copper interconnection.

The dual damascene process includes forming a trench having an upper interconnection formed on an insulating layer, and a via that connects the upper interconnection to a lower interconnection or to a substrate, and filling the trench and the via with copper. The resulting structure is then planarized by a chemical mechanical polishing (CMP) process.

The dual damascene process is employed in forming bit lines or word lines in addition to metal wiring. In particular, in the dual damascene process, vias for connecting an upper metal wiring to a lower metal wiring in a multi-layered metal wiring structure, can also be formed at the same time. Further, the dual damascene process facilitates further processing because a step difference caused by the metal wiring is removed during the dual damascene process. Dual damascene processes can be roughly classified into a via-first process and a trench-first process. In the via-first process, a via is first formed by etching a dielectric by photography and etching, and a trench is then formed on top of the via by further etching of the dielectric. In the trench-first process, on the contrary, the trench is first formed and the via is then formed. Of the two, the via-first process has enjoyed more common use.

Hereinafter a conventional method of fabricating a dual damascene interconnection will be described with reference to FIGS. 1A through 2B.

FIGS. 1A and 1B are sectional views of stages in a conventional method of fabricating a dual damascene interconnection. In some conventional dual damascene processes, a hard mask is used as an etch mask when trench etch is performed to form the trench. Referring to FIG. 1A, a hard mask 150 defining a trench 170 is patterned on an intermetalic dielectric (IMD) layer 140. When the IMD layer 140 is dry etched using the hard mask 150 as an etch mask, the hard mask 150 may be partially etched due to bombardment of ions within plasma during the formation of the trench 170. The dry etch is actively performed especially at an edge portion (A shown in FIG. 1A) of the hard mask 150, which defines the resulting size of the trench 170, forming a profile with a rounded edge. As a result, the IMD layer 140 positioned below the edge portion A of the hard mask 150 corresponding to an upper portion of the trench 170 is also etched so that the profile has a rounded edge. The rounded profile causes the critical dimension (CD) of an interconnection to be reduced.

Referring to FIG. 1B, after forming the trench 170 in the IMD layer 140, an etch-back process 180 is commonly performed to remove the hard mask 150 and an etch stop layer 130 exposed through via 160. During the mechanical etch-back process 180, in addition to the hard mask 150 and the etch stop layer 130, the exposed portion of the IMD 140 (portion B shown in FIG. 1B) of the trench 170 is also etched, increasing the roundness of the profile. As a result, the CD of the resulting interconnection can be even further reduced. In FIGS. 1A and 1B, reference numerals 110 and 120 denote a substrate and a lower interconnection line, respectively.

FIG. 2A is a scanning electron microscope (SEM) photo of the sectional view shown in FIG. 1A, and FIG. 2B is a SEM photo of the section view shown in FIG. 1B. Referring to FIG. 2A, during dry etch for forming a trench, the hard mask 210 is etched, which leads to a rounded-edge profile, as shown. Referring to FIG. 2B, when etch-back is performed to remove the hard mask 210 shown in FIG. 2A and to remove etch stop layer 230 exposed through a via, etching is also performed at an upper edge portion 220 of the trench, which cause the profile to become even more rounded.

As described above, during the dry etch for forming the trench 170 and the etch-back process 180 for removing the hard mask 150 and the etch stop layer 130, the IMD layer 140 is partially etched, since etch selectivity of the IMD layer 140 with respect to the hard mask 150 is not high in the case of a mechanical etch using plasma. As a result, the width of the resulting trench 170 exceeds a threshold value, and therefore, the dimension of the trench 170 cannot be controlled accurately.

In this situation, the CD of the interconnection is reduced, which may result in an unwanted increase in leakage current or even potentially cause a short-circuit in the interconnection. To overcome these problems, after an interconnection material is formed in the via 160 and the trench 170, additional chemical-mechanical polishing (CMP) may be performed to planarize the device so that satisfactory CD may be secured for the interconnection. However, excessive CMP can cause overall fabrication time to increase, leading to low product yield and other undesired effects.

SUMMARY OF THE INVENTION

The present invention provides a method of fabricating a dual damascene interconnection, by which a reliable trench profile is secured.

According to an aspect of the present invention, there is provided a method of fabricating a dual damascene interconnection, including (a) forming a lower interconnect feature on a substrate; (b) forming a dielectric layer on the lower interconnect feature; (c) forming a hard mask on the dielectric layer; (d) forming a via in the dielectric layer using the hard mask as an etch mask; (e) forming a trench hard mask defining a trench by patterning the hard mask; (f) forming a trench, which is connected with the via and in which an upper interconnection line is formed, by partially etching the dielectric layer using the trench hard mask as an etch mask; (g) removing the trench hard mask using wet etch; and (h) forming an upper interconnection line by filling the trench and the via with an interconnection material.

In one embodiment, the hard mask is formed using a material selected from the group consisting of SiN, SiC, BCB, Ta, TaN, Ti, TiN, $Al_2O_3$, BN, and combinations of them. In another embodiment, the hard mask is formed to a thickness of 2000 Å or greater.

In another embodiment, operation (g) comprises performing wet etch at an etch selectivity of the trench hard mask relative to the dielectric layer equal to or greater than 2000:1. In another embodiment, the wet etch is performed using a phosphoric acid solution. In another embodiment, the hard mask is formed using BN.

In another embodiment, the method further comprises: forming an etch stop layer on the lower interconnect feature before operation (b), wherein operation (d) comprises forming the via exposing the etch stop layer in the dielectric layer using the hard mask as the etch mask; and exposing the lower interconnection line by removing the etch stop layer exposed through the via before operation (h).

In another embodiment, the method further comprises forming an etch stop layer on the lower interconnection line before operation (b), wherein operation (d) comprises forming the via exposing the etch stop layer in the dielectric layer using the hard mask as the etch mask, and operation (g) comprises exposing the lower interconnect feature by simultaneously removing the etch stop layer exposed through the via and the trench hard mask using a single wet etching process.

In another embodiment, the etch stop layer and the trench hard mask are formed using a same material.

In another embodiment, operation (c) comprises forming a hard mask layer on the dielectric layer, forming a photoresist pattern defining the via on the hard mask layer, and patterning the hard mask using the photoresist pattern as an etch mask; and operation (d) comprises forming the via by dry etching the dielectric layer using the photoresist pattern and the hard mask as the etch mask.

In another embodiment, operation (e) comprises forming the trench hard mask using a photoresist pattern defining the trench, and removing the photoresist pattern; and operation (f) comprises forming the trench by dry etching the dielectric layer using the trench hard mask as the etch mask at an etch selectivity of the dielectric layer relative to the trench hard mask equal to or greater than 30:1.

In another embodiment, the hard mask is formed using BN, and the dielectric layer is formed using an oxide layer. In another embodiment, the dry etch is performed using one of $C_xF_y$ and $C_xH_yF_z$ as a major etching gas. In another embodiment, the upper interconnection line is a copper interconnection line. In another embodiment, the dielectric layer is formed using one of FSG and SiOC.

According to another aspect of the present invention, there is provided a method of fabricating a dual damascene interconnection, comprising: (a) forming a lower interconnect feature on a substrate; (b) forming an etch stop layer on the lower interconnect feature; (c) forming a dielectric layer on the etch stop layer, (d) forming a BN hard mask on the dielectric layer; (e) forming a via exposing the etch stop layer in the dielectric layer using the BN hard mask as an etch mask, (f) forming a trench hard mask defining a trench by patterning the BN hard mask; (g) forming a trench, which is connected with the via and in which an upper interconnection line is formed, by partially etching the dielectric layer using the trench hard mask as an etch mask, (h) removing the trench hard mask by performing wet etch using a phosphoric acid solution; (i) exposing the lower interconnect feature by removing the etch stop layer exposed through the via, and (j) forming an upper interconnection line by filling the trench and the via with an interconnection material.

In one embodiment, operation (d) comprises forming a BN hard mask layer on the dielectric layer, forming a photoresist pattern defining the via on the BN hard mask layer, and patterning the BN hard mask using the photoresist pattern as an etch mask; and operation (e) comprises forming the via exposing the etch stop layer by dry etching the dielectric layer using the photoresist pattern and the BN hard mask as the etch mask.

In another embodiment, operation (f) comprises forming the trench hard mask using a photoresist pattern defining the trench, and removing the photoresist pattern; and operation (g) comprises forming the trench by dry etching the dielectric layer using the trench hard mask as the etch mask at an etch selectivity of the dielectric layer relative to the trench hard mask equal to or greater than 30:1.

In another embodiment, the dry etch is performed using one of $C_xF_y$ and $C_xH_yF_z$ as a major etching gas. In another embodiment the upper interconnection line is a copper interconnection line. In another embodiment the dielectric layer is formed using one of FSG and SiOC.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1A:
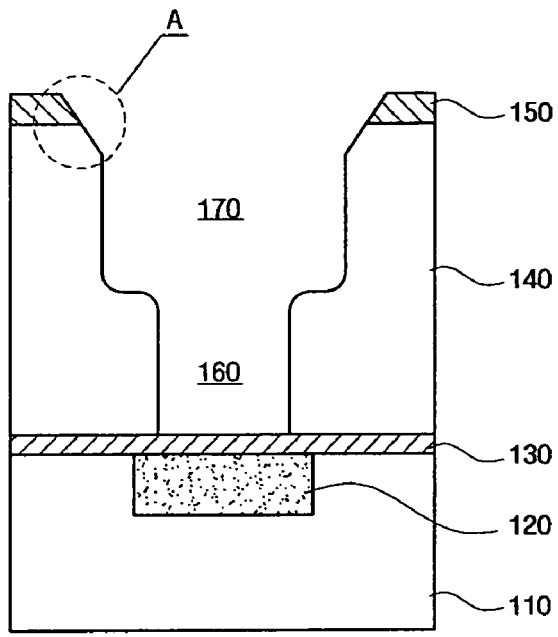
FIGS. 1A and 1B are sectional views of stages in a conventional method of fabricating a dual damascene interconnection.
Figure 1B:
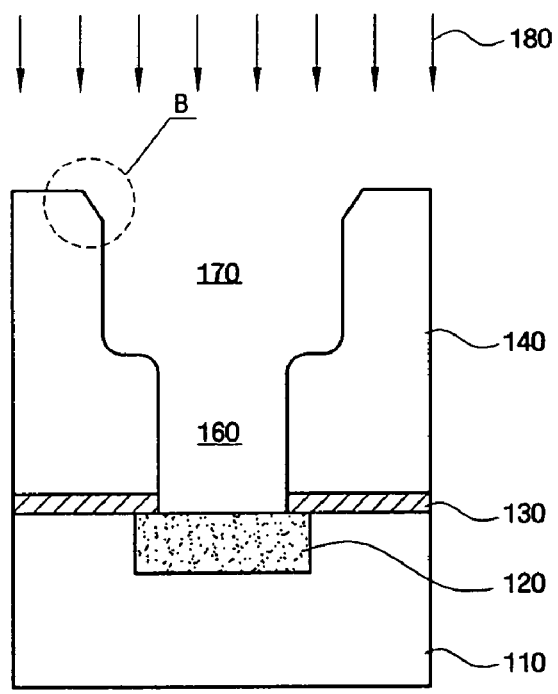
Figure 2A:
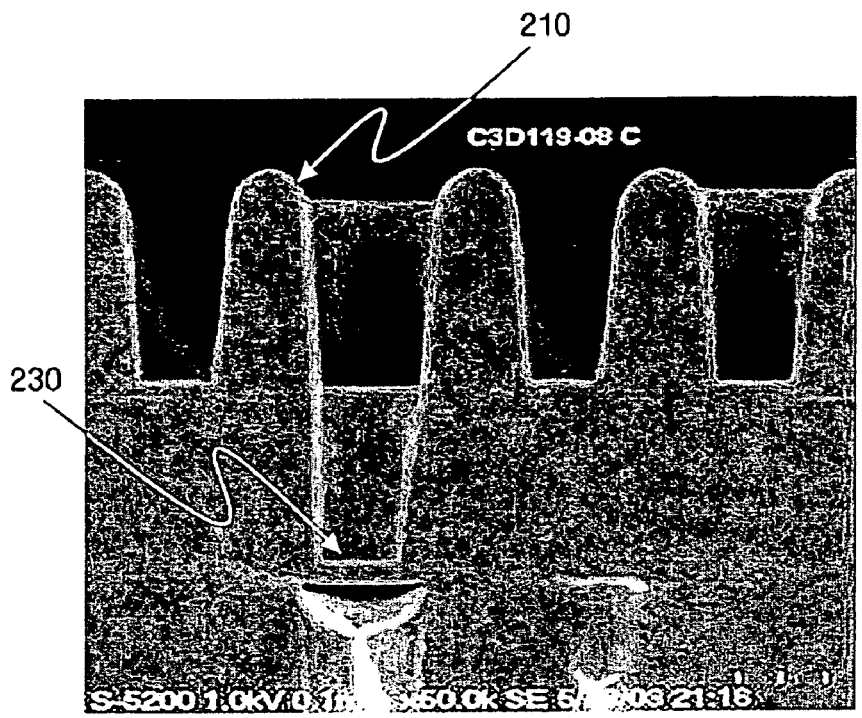
FIGS. 2A and 2B are respectively scanning electron microscope (SEM) images of the sectional views shown in FIGS. 1A and 1B.
Figure 2B:
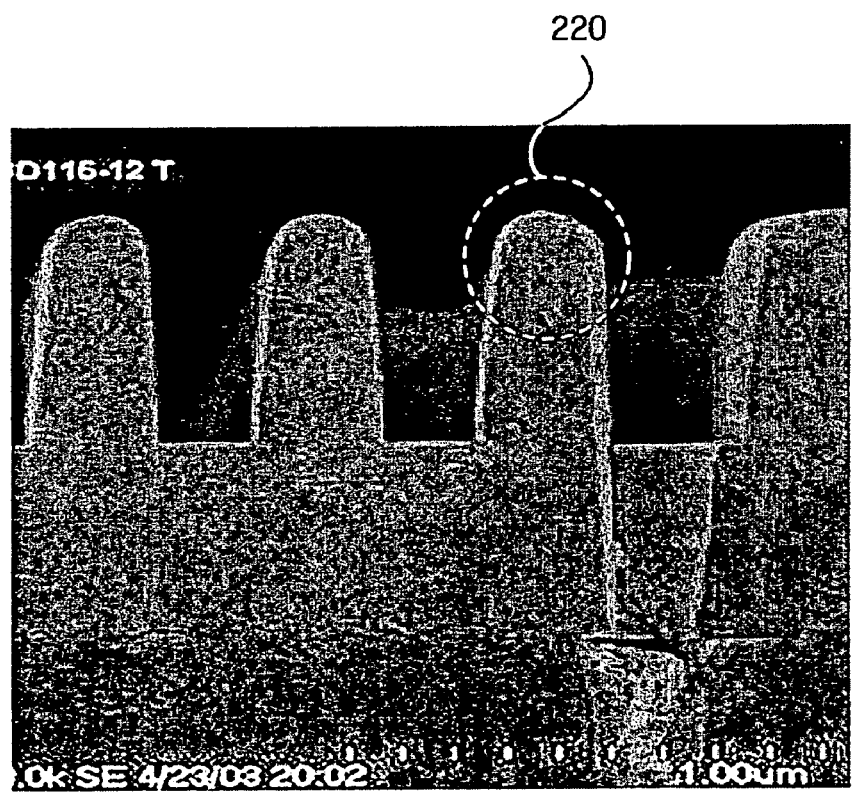

Advantages and features of the present invention and methods of accomplishing the same may be understood more readily with reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the invention to those skilled in the art. Like reference numerals refer to like elements throughout the specification.

A method of fabricating a dual damascene interconnection in accordance with the present invention can be used to fabricate microelectronic devices such as high-density integrated circuit (IC) semiconductor devices, processors, micro-electro-mechanical devices (MEM's), optoelectronic devices, and display devices. In particular, the present invention is more useful for a central processing unit (CPU), a digital signal processor (DSP), a combination of the CPU and the DSP, an application specific IC (ASIC), a logic device, static random access memory (SRAM), and others that require high-speed properties.

In embodiments of the present invention that will be described below, an opening exposing a lower interconnection line is referred to as a via, and an area where an upper interconnection line is formed is referred to as a trench. In addition, a via-first dual damascene process, in which a size of the via remains even in case of misalignment, is used as an example; however, the present invention is equally applicable to a trench-first process.

Hereinafter, embodiments of the present invention will be described with reference to FIGS. 3A through 3I.

FIGS. 3A through 3I are sectional views of stages in a method of fabricating a dual damascene interconnection according to an embodiment of the present invention.

Figure 3A:
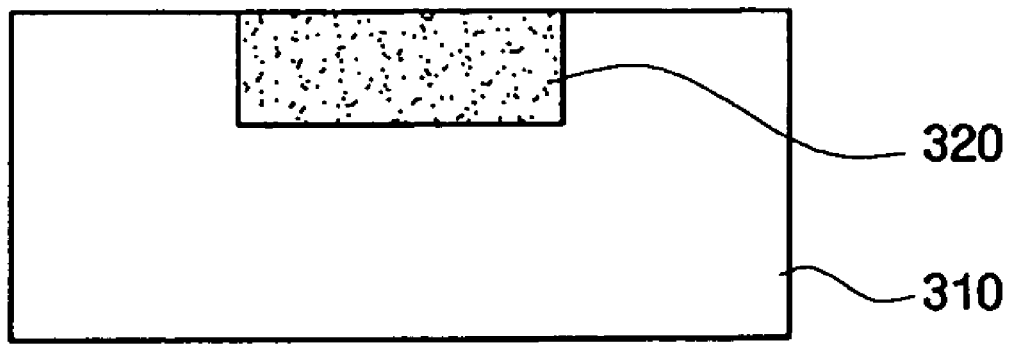
FIGS. 3A through 3I are sectional views of stages in a method of fabricating a dual damascene interconnection according to an embodiment of the present invention.

Referring to FIG. 3A, a substrate 310 on which a method of fabricating a dual damascene interconnection according to an embodiment of the present invention is performed is prepared. The substrate 310 has a lower interconnect feature, such as an interconnection line 320. As an example, the substrate 310 may be a silicon substrate, a silicon-on-insulator (SOI) substrate, a gallium arsenic substrate, a silicon germanium substrate, a ceramic substrate, a quartz substrate, or a glass substrate for display. The substrate 310 may have a diverse number of active devices and passive devices thereon. The lower interconnection line 320 may be formed using one of any of a number of interconnection materials, e.g., copper, copper alloys, aluminum, and aluminum alloys. In terms of low resistance, it is preferable to form the lower interconnection line 320 using copper. Also, it is preferable that the surface of the lower interconnection line 320 has been planarized.

Figure 3B:
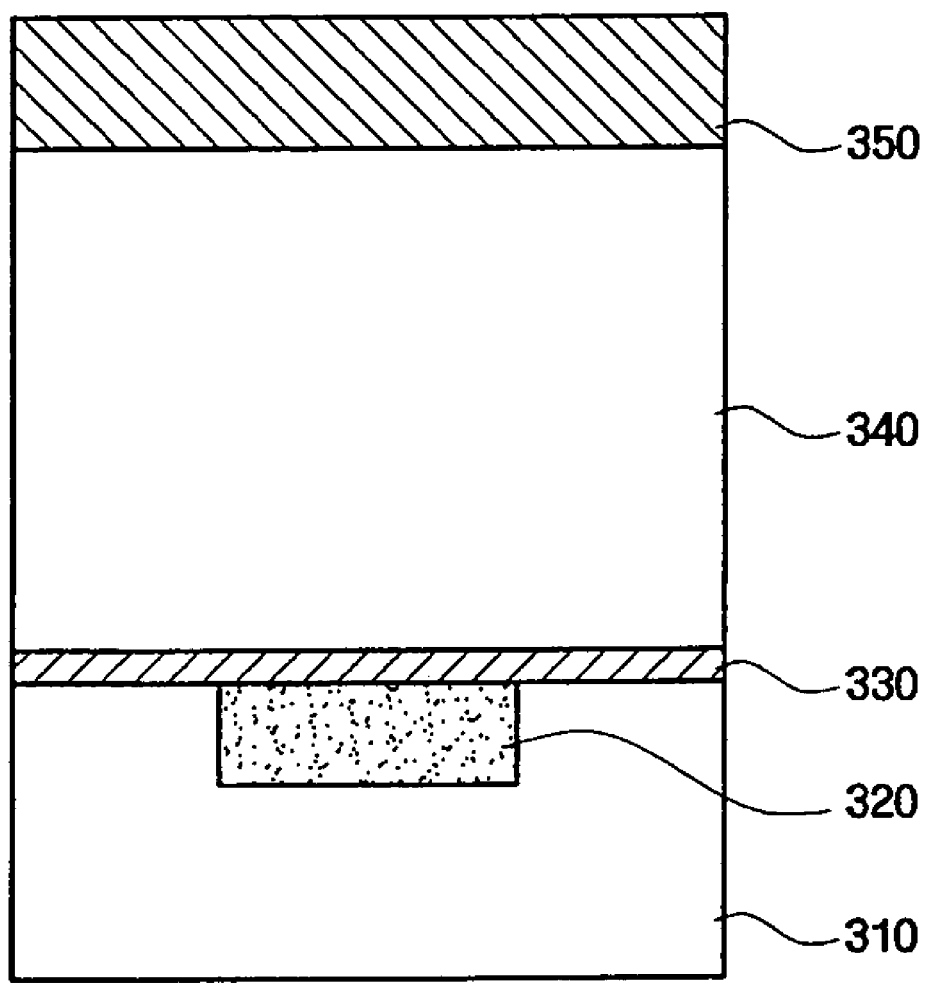
Figure 3C:
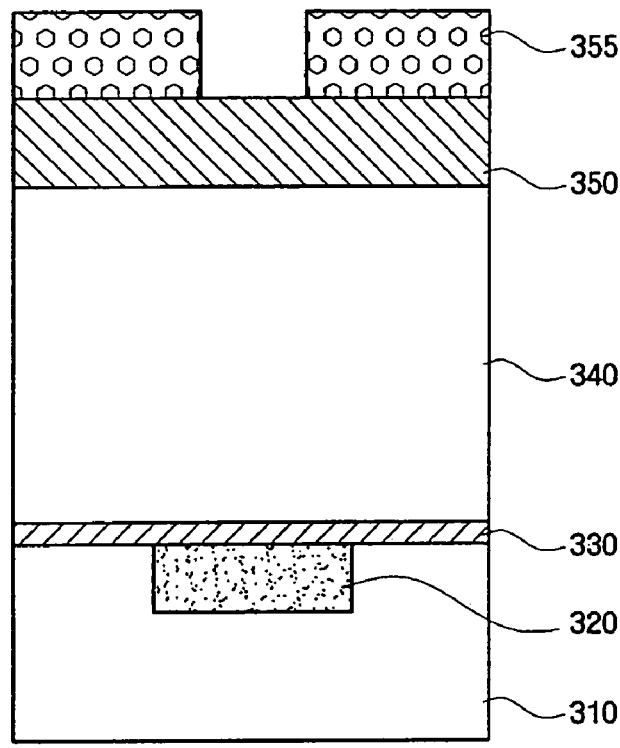

Referring to FIG. 3B, an etch stop layer 330, an intermetal dielectric (IMD) layer 340, and a hard mask layer 350 are sequentially formed on an entire surface of the substrate 310 having the lower interconnection line 320. Referring to FIG. 3C, a photoresist pattern 355 defining a via is formed on the hard mask layer 350.

The etch stop layer 330 is formed to prevent the lower interconnection line 320 from being exposed to subsequent etching processes, i.e., the dry etch process for forming the via and the dry etch process for forming the trench, and thus to prevent electrical properties of the lower interconnection line 320 from being damaged. Accordingly, the etch stop layer 330 is formed using a material having large etch selectivity with respect to the IMD layer 340 formed thereon. Preferably, the etch stop layer 330 is formed using one of SiC, SiN, SiCN, SiON, SiC/N-based materials, boron nitride (BN), and combinations of them, which have a dielectric constant of 4–5. The etch stop layer 330 should be formed to be as thin as possible with regard to influence on the dielectric constant of the entire IMD layer 340 and should be formed to be thick enough to satisfactorily perform its function. In addition to an etch stop function, the etch stop layer 330 can operate to stop diffusion of copper when the lower interconnection line 320 in the substrate 310 is formed using copper.

The IMD layer 340 can be formed using a low dielectric constant material having excellent thermal stability and a low dielectric constant. It is preferable to form the IMD layer 340 using a low dielectric constant material to prevent RC delay of a signal between the lower interconnection line 320 and an upper interconnection line to be formed and to suppress interference and power consumption. The IMD layer 340 may be formed to have sufficient thickness to form a via and a trench therein and may be formed using one of organic polymers having a low dielectric constant (i.e., a low-k) and doped oxide layers. The doped oxide layers may comprise, for example, a fluorine-doped oxide (or FSG) layer, a carbon-doped oxide layer, a silicon oxide layer, an HSQ (hydrogen silsesquioxane) (SiO:H) layer, an MSQ (methyl silsesquioxane) (SiO:CH3) layer, and an a-SiOC (SiOC:H) layer. The organic polymers having a low dielectric constant may comprise a polyallylether resin, a fluoride resin, a siloxane copolymer, a polyallylether fluoride resin, polypentafluorostyrene, a polytetrafluorostyrene resin, a fluoropolyimide resin, polynaphthalene fluoride, and a polycide resin. Alternatively, the IMD layer 340 may be formed using an existing $SiO_2$ film containing a large amount of carbon, i.e., a SiOC film. The SiOC film may be formed using methylsilane, demethylsilane, trimethylsilane, tetramethylsilane, or the like as a source.

The IMD layer 340 may be formed using plasma enhance chemical vapor deposition (PECVD), high density plasma CVD (HDP-CVD), atmospheric pressure CVD (APCVD), or spin coating. The IMD layer 340 may be formed to a thickness of 3000–20000 Å, and preferably a thickness of 6000–7000 Å. It is apparent to those skilled in the art that the thickness of the IMD layer 340 may be changed variously.

The hard mask layer 350 is used as an etch mask defining a trench in a subsequent trench etching process. Accordingly, it is preferable that the hard mask layer 350 is formed using a material having high etch selectivity to the IMD layer 340 in which a trench is formed. The hard mask layer 350 may comprise one of SiN, SiC, benzocyclobutene (BCB), Ta, TaN, Ti, TiN, $Al_2O_3$, BN, and combinations of them. It is preferable that the hard mask layer 350 used as an etch mask in a subsequent trench etching process is formed to a thickness of at least 1000 Å to prevent the IMD layer 340 positioned below the hard mask layer 350 from being etched. The hard mask layer 350 should be formed to a thickness that can be removed satisfactorily in a subsequent wet etching process.

The photoresist pattern 355 is formed by depositing photoresist suitable to a light source with a wavelength of 248 nm or less and performing exposure and development using a photomask defining a via.

Figure 3D:
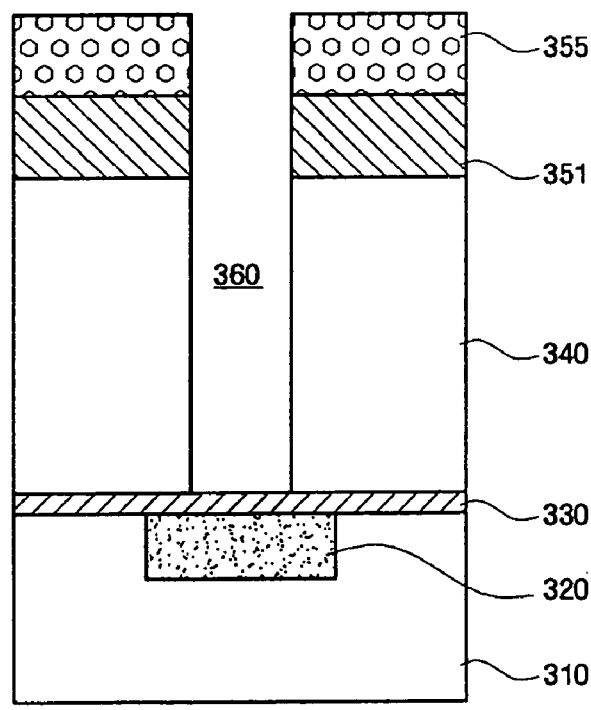

Referring to FIG. 3D, dry etch is performed to pattern the hard mask layer 350 using the photoresist pattern 355 as an etch mask, thereby forming a hard mask 351. The IMD layer 340 is dry etched using the photoresist pattern 355 and the hard mask 351 as an etch mask, thereby forming a via 360. Here, the etching process is performed until the etch stop layer 330 is exposed. Reactive ion etch (RIE) can be used for the dry etch process. RIE conditions are adjusted so that only the hard mask 351 and the IMD layer 340 are selectively etched without etch of the etch stop layer 330.

The via 360 may be filled with a filler (not shown) to protect the lower interconnection line 320 adjacent to the via 360 during subsequent etching and cleaning processes. The filler may be formed by spin coating using a material such as HSQ or SOG. The filler may be formed using a material and a method that are known to those skilled in the art and is not restricted thereto.

Figure 3E:
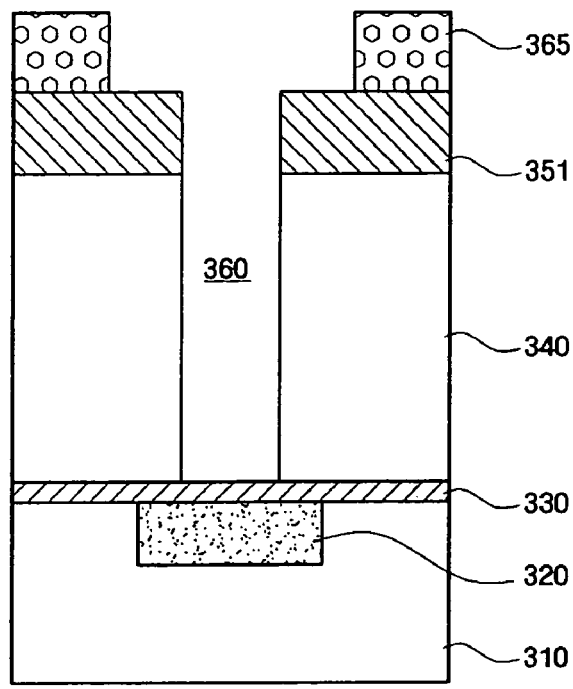

Referring to FIG. 3E, the photoresist pattern 355 used as an etch mask to form the via 360 is removed. To remove the photoresist pattern 355, a $O_2$ ashing process or $H_2$-based plasma process is performed and then a stripper is used. Thereafter, a photoresist pattern 365 defining a trench is formed on the hard mask 351. The photoresist pattern 355 is formed by depositing photoresist suitable to a light source with a wavelength of 248 nm or less and performing exposure and development using a photomask defining the trench.

Figure 3F:
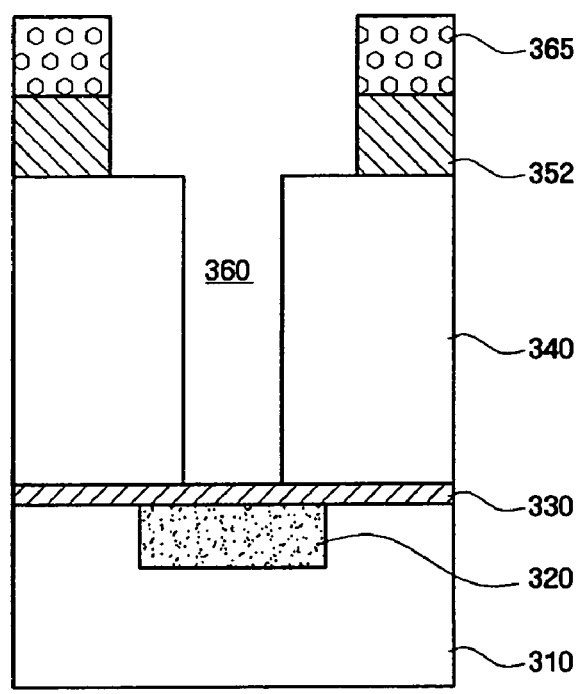

Referring to FIG. 3F, the hard mask 351 is dry etched using the photoresist pattern 365 as an etch mask, thereby forming a trench hard mask 352. Here, the dry etch is performed until the IMD layer 340 is exposed. RIE may be used for the dry etch and RIE conditions are adjusted so that only the hard mask 351 is selectively etched without etch of the IMD layer 340. The photoresist pattern 365 is removed by performing a $O_2$ ashing process or $H_2$-based plasma process and then using a stripper.

Figure 3G:
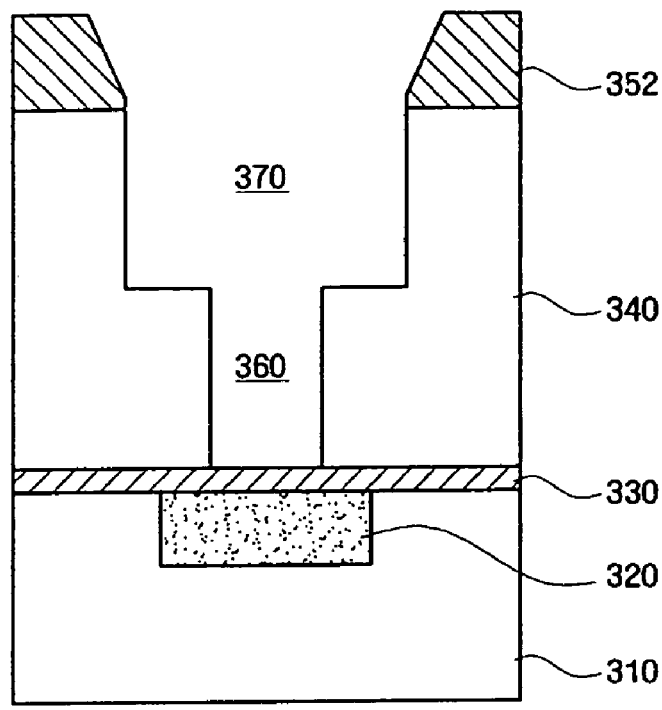

FIG. 3G illustrates a stage for forming a trench 370. The IMD layer 340 is dry etched to a predetermined thickness using the trench hard mask 352 as an etch mask, thereby forming the trench 370. For the dry etch, RIE is performed using $C_xF_y$ or $C_xH_yF_z$ as a major etching gas and a gas mixed with inert gas like Ar or a gas mixed with inert gas and at least one of $O_2$, $N_2$, and $CO_x$. It is preferable that the etch selectivity of the IMD layer 340 with respect to the trench hard mask 352 is 30:1. When the trench hard mask 352 is formed using BN and the IMD layer 340 is formed using an oxide layer containing $SiO_2$, SiOF, SiOC or the like, high etch selectivity can be achieved during the dry etching process.

Etching time control or an intermediate etch stop layer may be used to control the depth of the trench 370. Etching time control is a process of controlling a period of time during which dry etch is performed to form the trench 370 having a predetermined depth. When the intermediate etch stop layer (not shown) approach is used, an etch stop layer is formed in the IMD layer 340 at a vertical position that is to correspond with the bottom of the trench 370 to form an end point of the dry etch procedure in advance.

During the dry etch for forming the trench 370, while the IMD layer 340 is etched, an edge portion of the trench hard mask 352 is also etched, result in a rounded profile as shown in FIG. 3G. It is preferable that the trench hard mask 352 has a thickness of 1000 Å or greater to prevent an upper portion of the IMD layer 340 positioned below the trench hard mask 352 from being etched during the dry etch and thus to prevent the profile from being rounded at an edge of the trench 370.

Figure 3H:
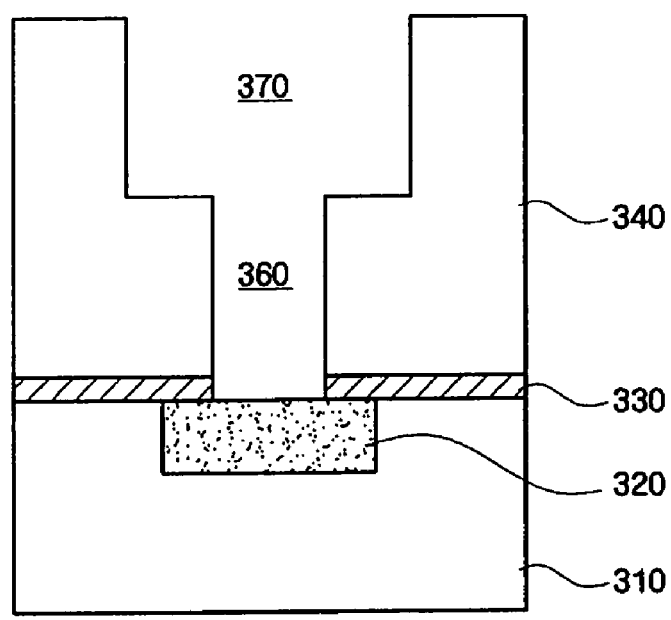

Referring to FIG. 3H, the trench hard mask 352 is removed using wet etch. To minimize etch of the IMD layer 340 forming the trench 370 and the via 360 when the trench hard mask 352 is wet etched, it is preferable that an etchant having an etch selectivity of the trench hard mask 352 relative to the IMD layer 340 equal to or greater than 2000:1 is used. In an embodiment of the present invention, when phosphoric acid ($H_3PO_4$) is used as an etchant to remove the trench hard mask 352, an etch selectivity of the trench hard mask 352 formed using BN relative to the IMD layer 340 formed using an oxide layer equal to or greater than 5000:1 can be achieved. When the trench hard mask 352 is removed using wet etch at high etch selectivity, only the trench hard mask 352 is selectively removed, without influencing the profile of the trench 370 and the via 360.

Also, the etch stop layer 330 exposed through the via 360 is removed to expose the lower interconnection line 320. Dry or wet etch may be used to remove the etch stop layer 330, and preferably dry etch is performed until the lower interconnection line 320 is exposed. For the dry etch, RIE may be performed under conditions such that only the etch stop layer 330 is selectively etched without influencing the lower interconnection line 320.

In an embodiment of the present invention, the trench hard mask 352 and the etch stop layer 330 exposed through the via 360 may be sequentially removed as described above, but the present invention is not restricted thereto this embodiment. For example, the trench hard mask 352 and the etch stop layer 330 may be removed by a single wet etching process. In this case, the trench hard mask 352 and the etch stop layer 330 may be formed using the same material.

Figure 3I:
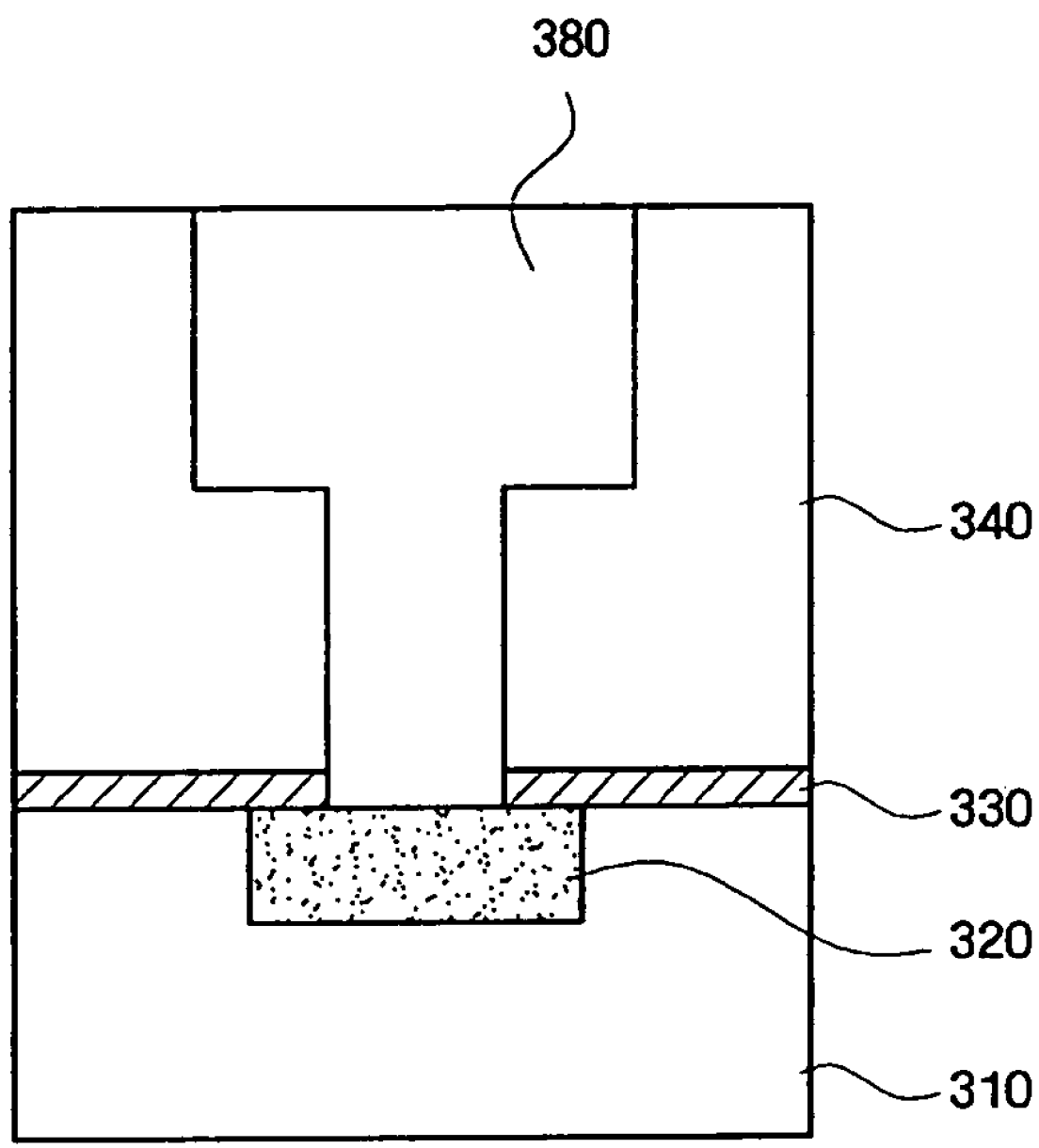

Referring to FIG. 3I, a conductive layer is formed in the IMD layer 340 in which the lower interconnection line 320 is exposed and the via 360 and the trench 370 are formed, and then planarization is performed, thereby forming an upper interconnection line 380. Since the trench hard mask 352 is removed using wet etch, the profile of the upper portion of the trench 370 remains in its initial, vertical, shape, and does not result in the rounded profile discussed above in connection with the conventional approaches. Accordingly, when performing planarization after forming the conductive layer in the IMD layer 340, it is not necessary to perform over chemical-mechanical polishing (CMP) to secure the critical dimensions (CD) of the interconnection.

A material of the conductive layer may be formed using at least one among aluminum (Al), aluminum alloy (Al-alloy), copper (Cu), gold (Au), silver (Ag), tungsten (W), and molybdenum (Mo). The conductive layer may be formed using a method of sputtering a conductive material and performing reflow, a CVD method, or an electroplating method. When using the electroplating method, a seed layer is required to flow current during electrolysis.

Moreover, a diffusion barrier layer (not shown) may be formed before the upper interconnection line 380 is formed. In particular, when Cu is used during a damascene process, the diffusion barrier layer is essential to prevent the IMD layer 340 from degrading in thermal characteristics due to diffusion of a Cu conductive material. The diffusion barrier layer may be formed using at least one among Ta, TaN, TiN, WN, TaC, WC, TiSiN, and TaSiN and using one method among physical vapor deposition (PVD), CVD, and atomic layer deposition (ALD).

As mentioned above, while the present invention is described above with reference to via-first dual damascene process, the present invention is equally applicable to a trench-first dual damascene process.

While this invention has been particularly shown and described with references to preferred embodiments thereof, it will be understood by those skilled in the art that various changes in form and detail may be made herein without departing from the spirit and scope of the invention as defined by the appended claims.

As described above, according to the present invention, a profile of a trench can be reliably reproduced and desired CD can be secured on an interconnection without the need for an over CMP process. Accordingly, a dual damascene interconnection with improved performance can be provided.

What is claimed is:

1. A method of fabricating a dual damascene interconnection, comprising:
   (a) forming a lower interconnect feature on a substrate;
   (b) forming a dielectric layer on the lower interconnect feature;
   (c) forming a hard mask on the dielectric layer, wherein the hard mask is formed using BN, and the dielectric layer is formed using an oxide layer;
   (d) forming a via in the dielectric layer using the hard mask as an etch mask;
   (e) forming a trench hard mask defining a trench by patterning the hard mask;

(f) forming a trench, which is connected with the via and in which an upper interconnection line is formed, by partially etching the dielectric layer using the trench hard mask as an etch mask;

(g) removing the trench hard mask using wet etch; and (h) forming an upper interconnection line by filling the trench and the via with an interconnection material.

2. The method of claim 1, wherein the hard mask is formed to a thickness of 1000 Å or greater.

3. The method of claim 1, wherein operation (g) comprises performing wet etch at an etch selectivity of the trench hard mask relative to the dielectric layer equal to or greater than 2000:1.

4. The method of claim 3, wherein the wet etch is performed using a phosphoric acid solution.

5. The method of claim 3, further comprising:

forming an etch stop layer on the lower interconnect feature before operation (b), wherein operation (d) comprises forming the via exposing the etch stop layer in the dielectric layer using the hard mask as the etch mask; and exposing the lower interconnection feature by removing the etch stop layer exposed through the via before operation (h).

6. The method of claim 3, further comprising forming an etch stop layer on the lower interconnection feature before operation (b), wherein operation (d) comprises forming the via exposing the etch stop layer in the dielectric layer using the hard mask as the etch mask, and operation (g) comprises exposing the lower interconnect feature by simultaneously removing the etch stop layer exposed through the via and the trench hard mask using a single wet etching process.

7. The method of claim 6, wherein the etch stop layer and the trench hard mask are formed using a same material.

8. The method of claim 1, wherein operation (c) comprises forming a hard mask layer on the dielectric layer, forming a photoresist pattern defining the via on the hard mask layer, and patterning the hard mask using the photoresist pattern as an etch mask; and operation (d) comprises forming the via by dry etching the dielectric layer using the photoresist pattern and the hard mask as the etch mask.

9. The method of claim 1, wherein operation (e) comprises forming the trench hard mask using a photoresist pattern defining the trench, and removing the photoresist pattern; and operation (f) comprises forming the trench by dry etching the dielectric layer using the trench hard mask as the etch mask at an etch selectivity of the dielectric layer relative to the trench hard mask equal to or greater than 30:1.

10. The method of claim 9, wherein the dry etch is performed using one of $C_xF_y$ and $C_xH_yF_z$ as a major etching gas.

11. The method of claim 1, wherein the upper interconnection line is a copper interconnection line.

12. The method of claim 11, wherein the dielectric layer is formed using one of FSG and SiOC.

13. A method of fabricating a dual damascene interconnection, comprising:

(a) forming a lower interconnect feature on a substrate;

(b) forming an etch stop layer on the lower interconnect feature;

(c) forming a dielectric layer on the etch stop layer (d) forming a BN hard mask on the dielectric layer;

(e) forming a via exposing the etch stop layer in the dielectric layer using the BN hard mask as an etch mask;

(f) forming a trench hard mask defining a trench by patterning the BN hard mask;

(g) forming a trench, which is connected with the via and in which an upper interconnection line is formed, by partially etching the dielectric layer using the trench hard mask as an etch mask;

(h) removing the trench hard mask by performing wet etch using a phosphoric acid solution;

(i) exposing the lower interconnect feature by removing the etch stop layer exposed through the via; and (j) forming an upper interconnection line by filling the trench and the via with an interconnection material.

14. The method of claim 13, wherein operation (d) comprises forming a BN hard mask layer on the dielectric layer, forming a photoresist pattern defining the via on the BN hard mask layer, and patterning the BN hard mask using the photoresist pattern as an etch mask; and operation (e) comprises forming the via exposing the etch stop layer by dry etching the dielectric layer using the photoresist pattern and the BN hard mask as the etch mask.

15. The method of claim 14, wherein operation (f) comprises forming the trench hard mask using a photoresist pattern defining the trench, and removing the photoresist pattern; and operation (g) comprises forming the trench by dry etching the dielectric layer using the trench hard mask as the etch mask at an etch selectivity of the dielectric layer relative to the trench hard mask equal to or greater than 30:1.

16. The method of claim 15, wherein the dry etch is performed using one of $C_xF_y$ and $C_xH_yF_z$ as a major etching gas.

17. The method of claim 15, wherein the upper interconnection line is a copper interconnection line.

18. The method of claim 17, wherein the dielectric layer is formed using one of FSG and SiOC.

* * * * *